(12) United States Patent
Matsuura

(10) Patent No.: US 11,069,617 B2
(45) Date of Patent: Jul. 20, 2021

(54) SEMICONDUCTOR DEVICE AND NONVOLATILE MEMORY

(71) Applicant: TOSHIBA MEMORY CORPORATION, Minato-ku (JP)

(72) Inventor: Osamu Matsuura, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 24 days.

(21) Appl. No.: 16/243,146

(22) Filed: Jan. 9, 2019

(65) Prior Publication Data
US 2020/0051908 A1 Feb. 13, 2020

(30) Foreign Application Priority Data
Aug. 10, 2018 (JP) .............................. JP2018-151706

(51) Int. Cl.
| H01L 29/792 | (2006.01) |
| H01L 23/528 | (2006.01) |
| H01L 23/522 | (2006.01) |
| H01L 27/115 | (2017.01) |
| H01L 27/108 | (2006.01) |
| H01L 27/11573 | (2017.01) |
| H01L 27/11565 | (2017.01) |
| H01L 27/112 | (2006.01) |

(52) U.S. Cl.
CPC ........ *H01L 23/528* (2013.01); *H01L 23/5226* (2013.01); *H01L 23/5283* (2013.01); *H01L 27/10891* (2013.01); *H01L 27/115* (2013.01); *H01L 27/11565* (2013.01); *H01L 27/11573* (2013.01); *H01L 27/11286* (2013.01)

(58) Field of Classification Search
CPC ............. H01L 23/5226; H01L 23/5283; H01L 27/115; H01L 27/11286; H01L 23/485; H01L 27/11565; H01L 27/10891; H01L 23/528; H01L 27/11573; H01L 27/0688; H01L 27/1052
See application file for complete search history.

(56) References Cited

U.S. PATENT DOCUMENTS

| 6,737,714 | B2 | 5/2004 | Masuda et al. | |
| 7,875,922 | B2 * | 1/2011 | Arai | H01L 29/7926 257/316 |
| 9,064,724 | B2 * | 6/2015 | Oh | H01L 27/11573 |
| 10,090,315 | B2 * | 10/2018 | Fukuzumi | H01L 25/50 |
| 2010/0320526 | A1 * | 12/2010 | Kidoh | H01L 27/11582 257/324 |

(Continued)

FOREIGN PATENT DOCUMENTS

| JP | 4-109677 | 4/1992 |
| JP | 11-195787 | 7/1999 |
| JP | 2006-093259 | 4/2006 |

*Primary Examiner* — Shouxiang Hu
(74) *Attorney, Agent, or Firm* — Oblon, McClelland, Maier & Neustadt, L.L.P.

(57) ABSTRACT

According to one embodiment, a semiconductor device includes a transistor having a diffusion layer extending along a surface of a substrate and a gate electrode arranged above the diffusion layer; and contacts having elongated bottom surfaces connected to the diffusion layer on both sides of the gate electrode, in which the contacts are arranged so that the bottom surfaces of the contacts are not aligned in a straight line with an extension direction of the diffusion layer.

18 Claims, 6 Drawing Sheets

(56) References Cited

U.S. PATENT DOCUMENTS

2012/0001271 A1* 1/2012 Chae ................. H01L 29/4238
257/401
2017/0047348 A1 2/2017 Abe et al.

* cited by examiner

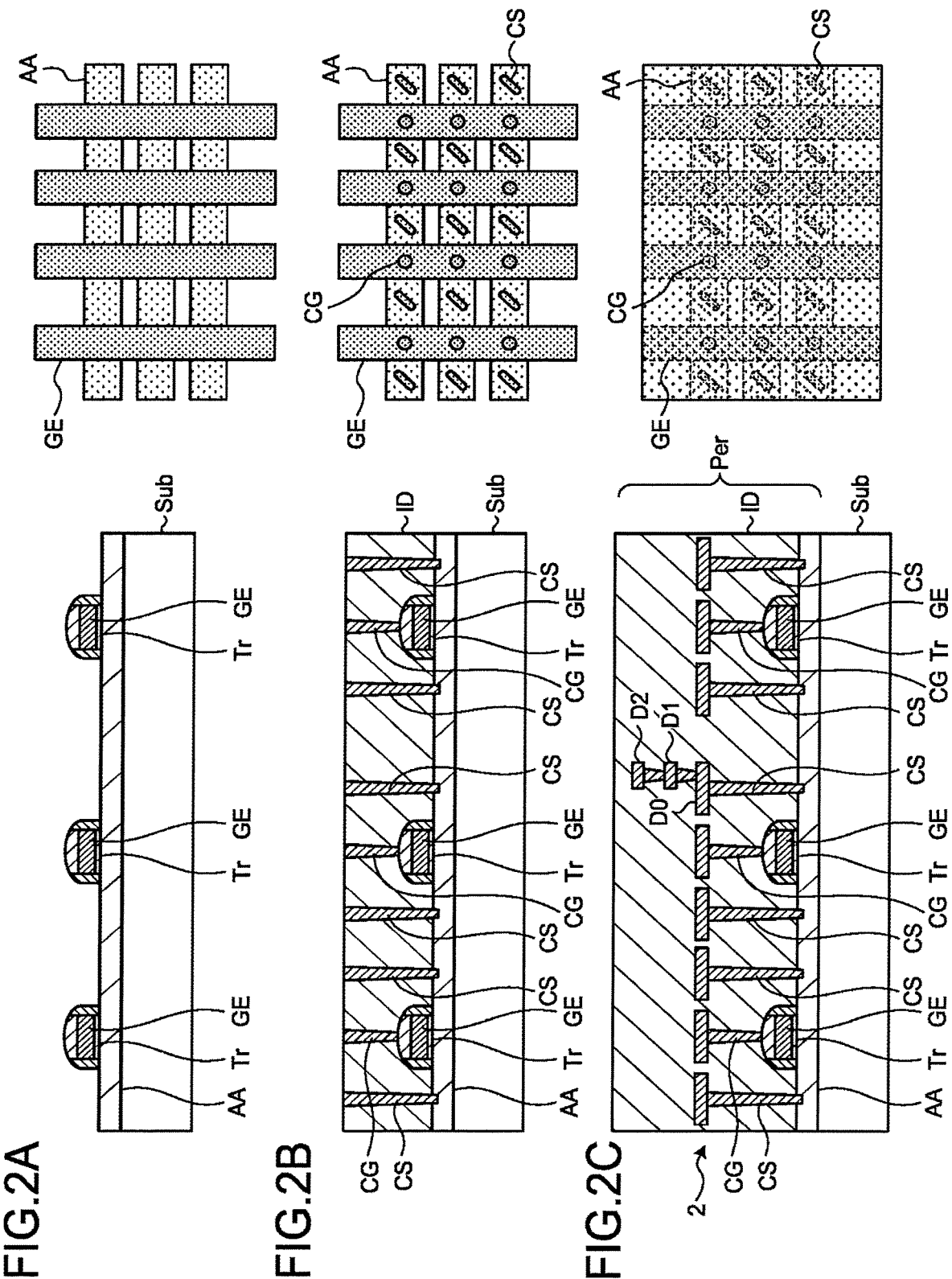

SEMICONDUCTOR DEVICE AND NONVOLATILE MEMORY

CROSS-REFERENCE TO RELATED APPLICATIONS

This application is based upon and claims the benefit of priority from Japanese Patent Application No. 2018-151706, filed on Aug. 10, 2018; the entire contents of which are incorporated herein by reference.

FIELD

Embodiments described herein relate generally to a semiconductor device and a nonvolatile memory.

BACKGROUND

A semiconductor device includes a transistor having a gate electrode and a diffusion layer formed on a substrate. On both sides of the gate electrode, source/drain contacts connected to the diffusion layer are formed. In the transistor, it is desirable that a variation in threshold voltage is small.

BRIEF DESCRIPTION OF THE DRAWINGS

FIG. 2A is a flow diagram illustrating an example of a procedure of a manufacturing process of the nonvolatile memory according to the embodiment;

FIG. 2B is a flow diagram illustrating an example of the procedure of the manufacturing process of the nonvolatile memory according to the embodiment;

FIG. 2C is a flow diagram illustrating an example of the procedure of the manufacturing process of the nonvolatile memory according to the embodiment;

DETAILED DESCRIPTION

In general, according to one embodiment, a semiconductor device includes a transistor having a diffusion layer extending along a surface of a substrate and a gate electrode arranged above the diffusion layer; and contacts having elongated bottom surfaces connected to the diffusion layer on both sides of the gate electrode, in which the contacts are arranged so that the bottom surfaces of the contacts are not aligned in a straight line with an extension direction of the diffusion layer.

Hereinafter, the present invention will be described in detail with reference to the drawings. In addition, the present invention is not limited by the following embodiments. In addition, constituent elements in the following embodiments include those that can be easily assumed by those skilled in the art or those that are substantially the same.

(Example of Configuration of Nonvolatile Memory)

Figure 1A:
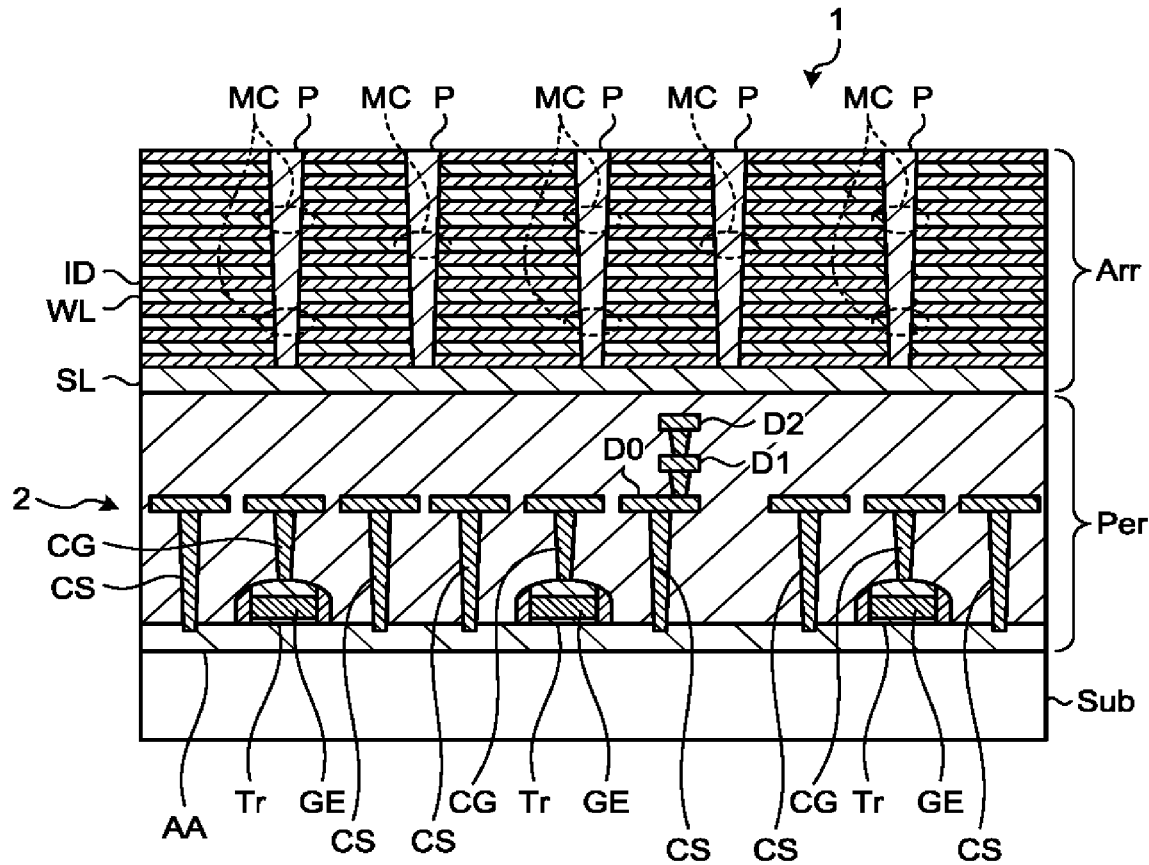
FIG. 1A is a diagram schematically illustrating an example of a configuration of a nonvolatile memory according to an embodiment.

FIG. 1A is a cross-sectional view schematically illustrating an example of a configuration of a nonvolatile memory 1 according to the embodiment. The cross section illustrated in FIG. 1A is along the extension direction of the active region AA described later. As illustrated in FIG. 1A, the nonvolatile memory 1 is configured as a three-dimensional nonvolatile memory including, for example, a memory cell array Arr and a peripheral circuit Per arranged below the memory cell array Arr. In the memory cell array Arr, a plurality of memory cells MC are arranged in a matrix shape. The peripheral circuit Per contributes to operations of the memory cells MC.

In the memory cell array Arr, a plurality of word lines WL and interlayer insulating layers ID are stacked in a direction perpendicular to the surface of a wafer (substrate) Sub, and pillars P penetrating the word lines WL and the interlayer insulating layers ID are provided. The pillar P has a channel layer and a memory layer and is connected to a source line SL. As a result, the memory cells MC are three-dimensionally arranged along the height direction of the pillar P.

The peripheral circuit Per includes transistors Tr. The transistor Tr includes an active region AA which is a diffusion layer provided in the wafer Sub and a gate electrode GE above the active region AA. A gate contact CG is connected to the gate electrode GE. Source/drain contacts CS are connected to the active regions AA, that is, the source region and the drain region, on both sides of the gate electrode GE. The source/drain contacts CS are connected to a wiring layer D0 and is further connected to wiring layers D1, D2, and the like, as the upper layers of the wiring layer D0 through a plurality of contacts. A semiconductor device 2 is mainly configured with the transistors Tr, the gate contacts CG, the source/drain contacts CS, and the wiring layers D0 to D2.

Figure 1B:
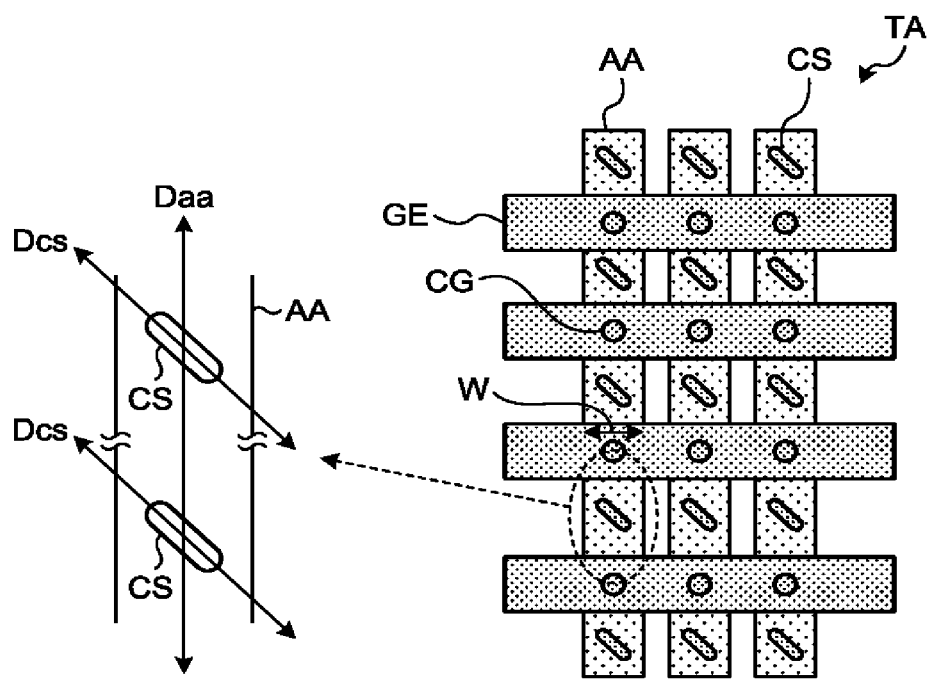
FIG. 1B is a diagram schematically illustrating an example of the configuration of a semiconductor device included in the nonvolatile memory according to the embodiment.

FIG. 1B is a plan view schematically illustrating an example of the configuration of the semiconductor device 2 included in the nonvolatile memory 1 according to the embodiment. As illustrated in FIG. 1B, on the wafer Sub, a plurality of elongated active regions AA are provided so as to be aligned in the transverse direction. Above the active region AA, a plurality of gate electrodes GE extending in a direction intersecting the extension direction of the active region AA, for example, in a direction perpendicular to the extension direction of the active region AA are provided so as to be aligned in the transverse direction. A channel is formed in the active region AA right under the gate electrode GE. On each gate electrode GE, a gate contact CG is provided. On both sides of each gate electrode GE, the source/drain contacts CS are provided.

From the viewpoint of reducing the contact resistance, the bottom surfaces of the source/drain contacts CS have, for example, an elongated shape such as an elliptical shape. In a plurality of source/drain contacts CS arranged in the extension direction of the active region AA, each of the source/drain contacts CS is arranged so that the extension direction Dcs of the bottom surface having an elongated shape is not aligned in a straight line with the extension direction Daa of the active region AA. More specifically, each of the source/drain contacts CS is arranged in a direction in which the extension direction Dcs of the bottom surface intersects the extension direction Daa of the active region AA. In other words, the bottom surfaces of the source/drain contacts CS are arranged to be inclined with respect to the active region AA extending in an elongated shape. The angle formed between the extension direction Dcs of the bottom surface and the extension direction Daa of the active region AA is, for example, 10° or more.

Meanwhile, the extension direction Daa of the active region AA and, for example, the extension direction of the gate electrode GE perpendicular to the extension direction Daa are a directions in which the crystal of the wafer Sub cleaves. The extension direction Dcs of the bottom surfaces of the source/drain contacts CS arranged to be inclined with respect to the extension direction Daa of the active region AA is also arranged to be inclined with respect to the cleavage direction of the wafer Sub.

As described above, a transistor array TA in which a plurality of transistors Tr are two-dimensionally arranged in a matrix shape is configured. In the example of FIG. 1B, each transistor Tr in the transistor array TA shares a source region and a drain region with a transistor Tr adjacent in the parallel direction. In addition, the gate width W of each gate electrode GE is, for example, 1 µm or less. By configuring the transistor array TA in this manner, it is possible to densely arrange the plurality of transistors Tr in a small area.

(Example of Manufacturing Process of Nonvolatile Memory)

Next, an example of the manufacturing process of the nonvolatile memory 1 will be described with reference to FIGS. 2A to 2C, 3A, 3B, 4A, and 4B. FIGS. 2A to 2C, 3A, 3B, 4A, and 4B are flow diagrams illustrating an example of the procedure of the manufacturing process of the nonvolatile memory 1 according to the embodiment. The views of the left sides illustrated in FIGS. 2A to 2C and the drawings illustrated in FIGS. 3A, 3B, 4A, and 4B are cross-sectional views of the nonvolatile memory 1 in the manufacturing process. The drawings of the right sides illustrated in FIGS. 2A to 2C are plan views of the nonvolatile memory 1 in the manufacturing process.

As illustrated in FIG. 2A, ion implantation or the like is performed on the wafer Sub to form the active region AA. In addition, above the active region AA, for example, the gate electrode GE is formed so as to be perpendicular to the active region AA. As a result, the transistor Tr is formed.

As illustrated in FIG. 2B, the interlayer insulating layer ID is formed so as to cover the active region AA, the gate electrode GE, and the like. Then, the gate contacts CG and the source/drain contacts CS that penetrate the interlayer insulating layer ID and are connected to the gate electrode GE and the active region AA, respectively, are formed. At this time, for example, the bottom surfaces of the source/drain contacts CS having an elongated shape such as an elliptical shape are arranged to be inclined with respect to the active region AA.

As illustrated in FIG. 2C, while further stacking the interlayer insulating layers ID, the wiring layers D0 to D2 connected by contacts are formed. As a result, the semiconductor device 2 and the peripheral circuit Per are formed.

Figure 3A:
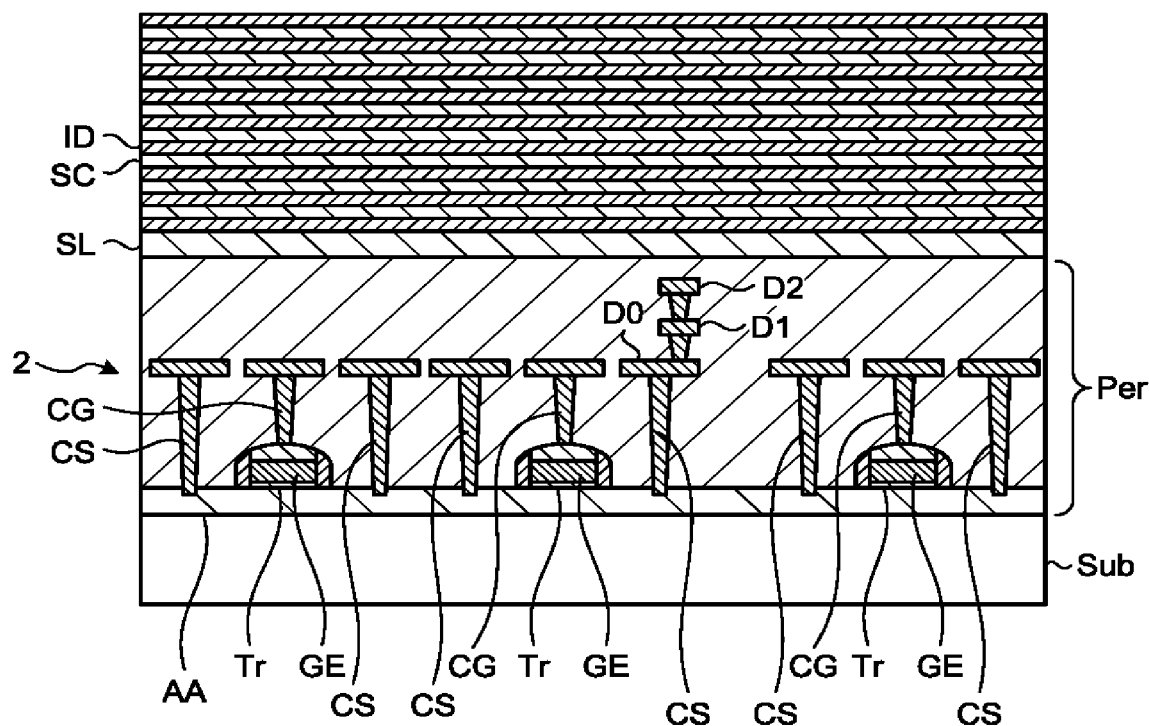
FIG. 3A is a flow diagram illustrating an example of the procedure of the manufacturing process of the nonvolatile memory according to the embodiment.

As illustrated in FIG. 3A, a source line SL is formed above the peripheral circuit Per. In addition, a plurality of sacrificial layers SC and a plurality of interlayer insulating layers ID are stacked on the source line SL.

Figure 3B:
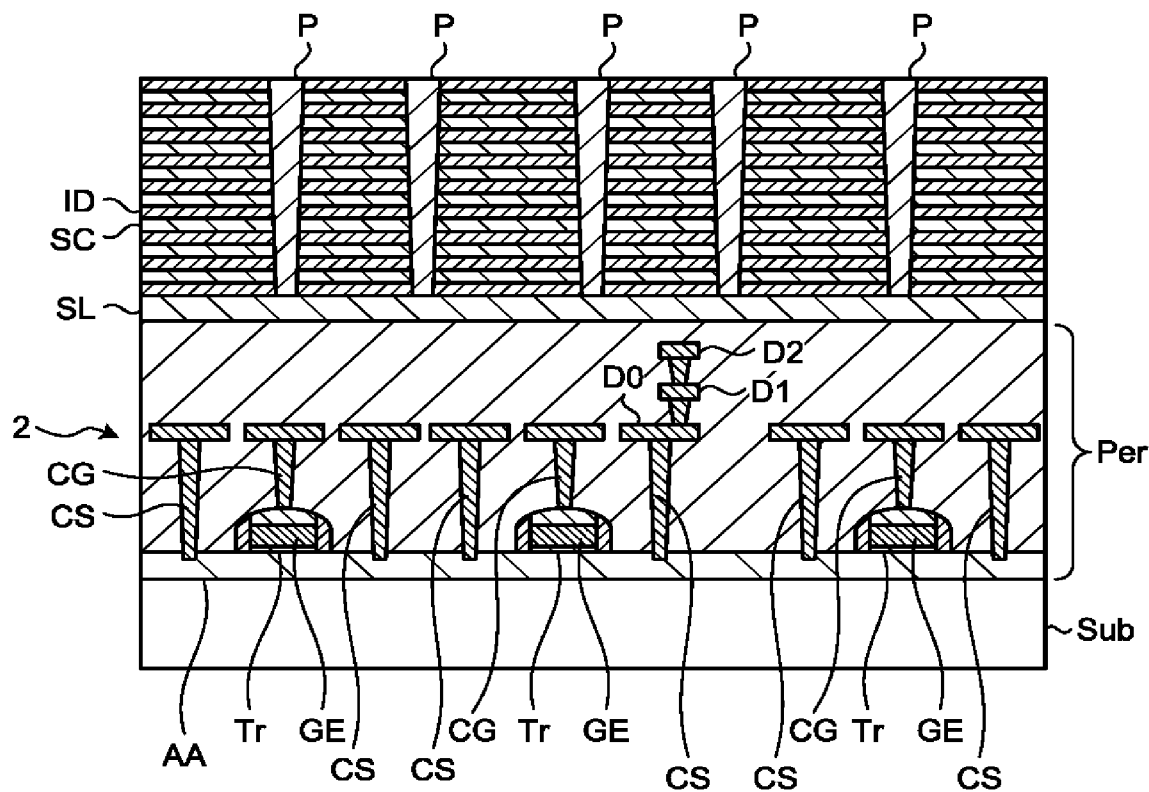
FIG. 3B is a flow diagram illustrating an example of the procedure of the manufacturing process of the nonvolatile memory according to the embodiment.

As illustrated in FIG. 3B, pillars P penetrating the sacrificial layers SC and the interlayer insulating layers ID and reaching the source line SL are formed. The pillar P has a columnar channel and a memory layer covering a side surface of the channel.

Figure 4A:
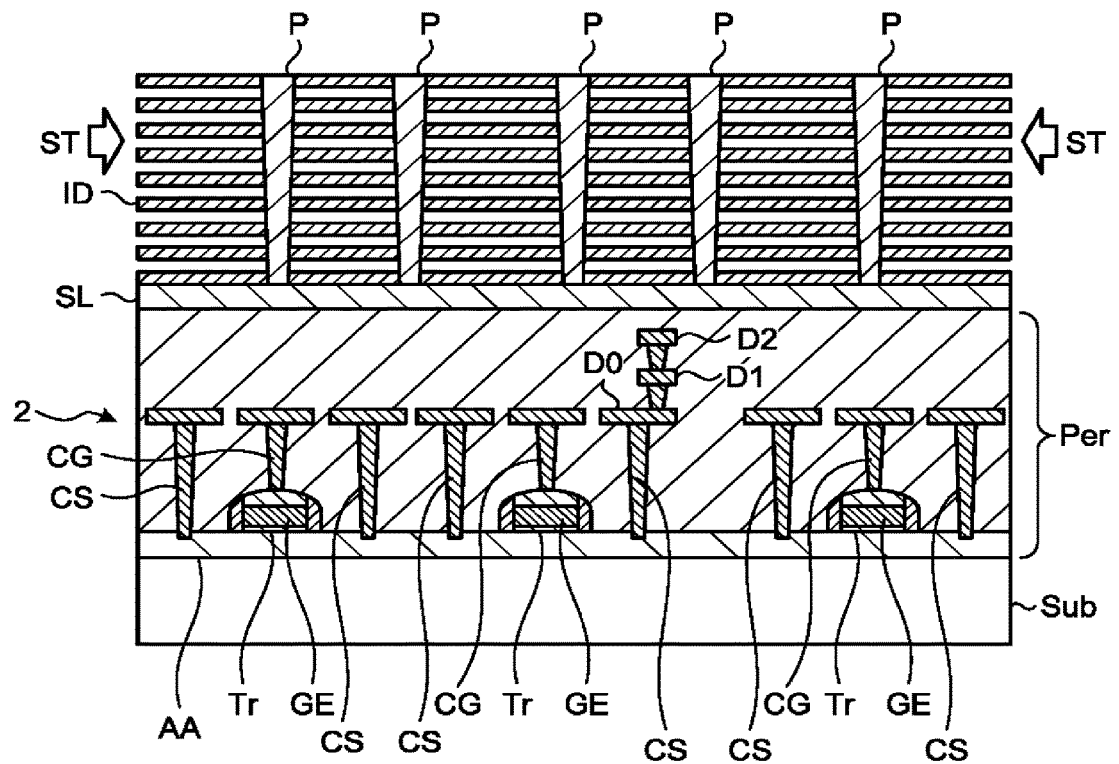
FIG. 4A is a flow diagram illustrating an example of the procedure of the manufacturing process of the nonvolatile memory according to the embodiment.

As illustrated in FIG. 4A, the sacrificial layers SC are removed via a slit ST (not illustrated) penetrating the sacrificial layers SC and the interlayer insulating layers ID at the outer edge portion.

Figure 4B:
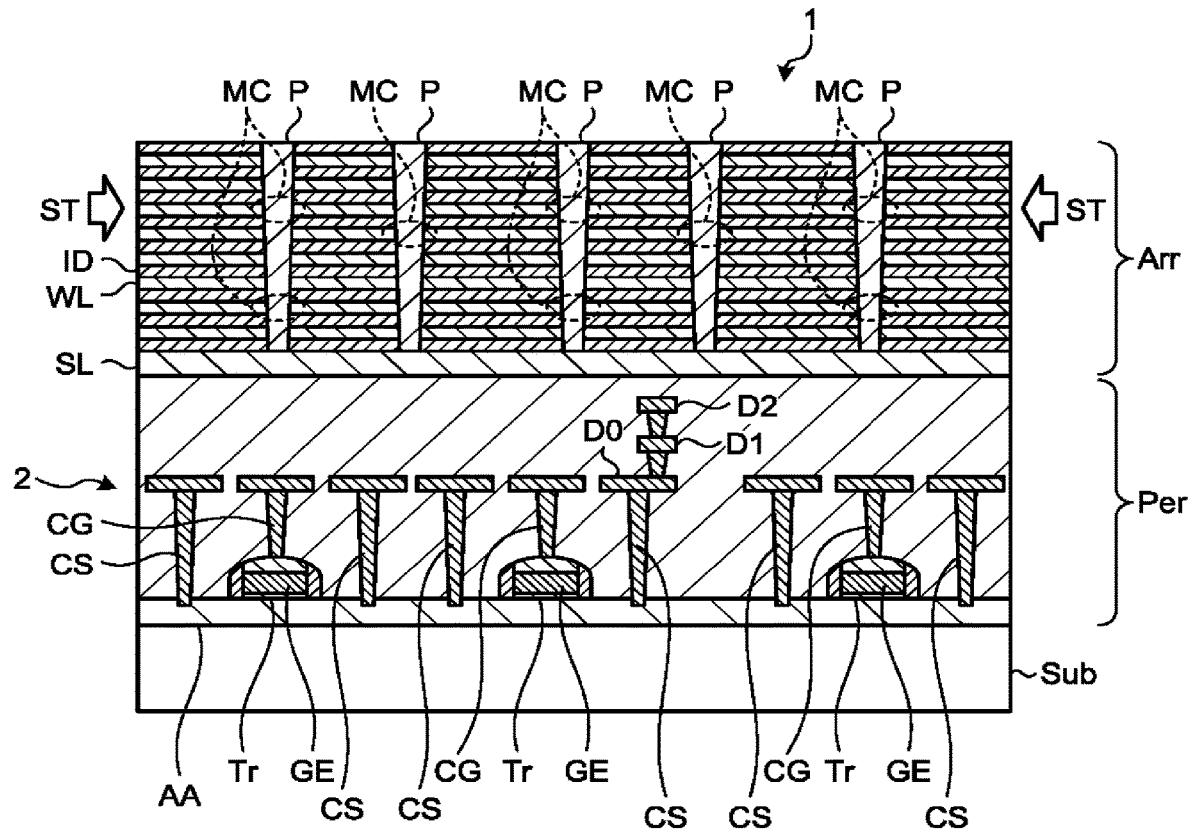
FIG. 4B is a flow diagram illustrating an example of the procedure of the manufacturing process of the nonvolatile memory according to the embodiment.

As illustrated in FIG. 4B, spaces formed by removing the sacrificial layers SC through the slit ST (not illustrated) are filled with a conductor to form word lines WL. As a result, the memory cell array Arr and the nonvolatile memory 1 are formed.

As described above, the method of removing the sacrificial layers SC and forming the word lines WL therein is called replacement. During the replacement, the entire configuration of the nonvolatile memory 1 being formed may be subject to thermal history.

(Threshold Value of Transistor)

Figure 5:
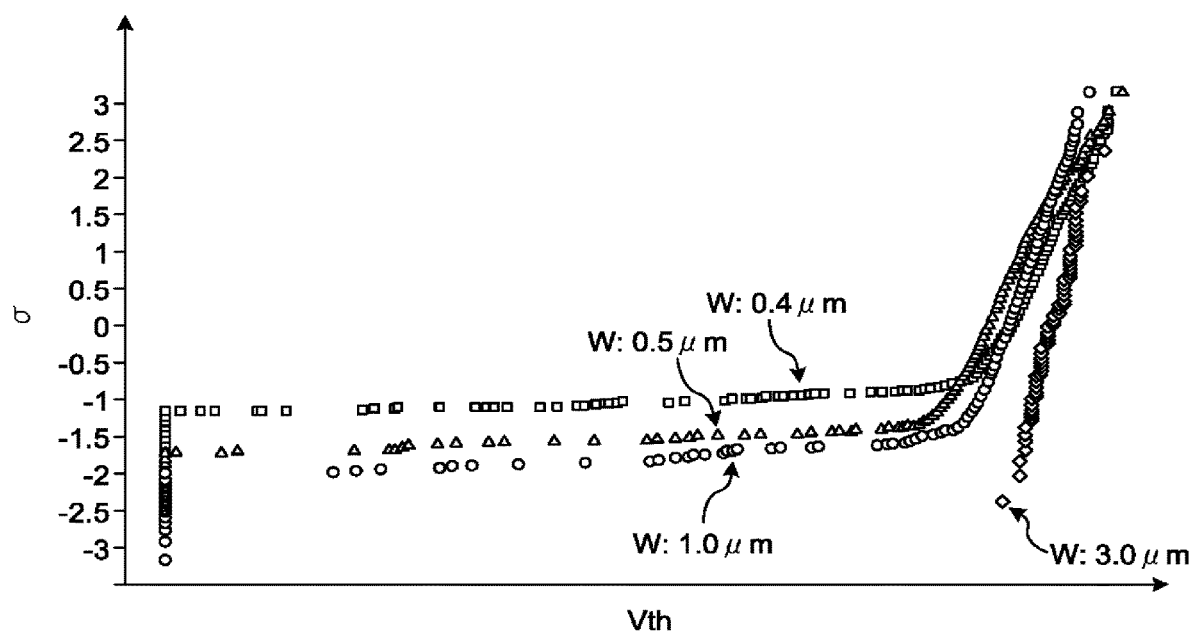
FIG. 5 is a normal probability plot illustrating threshold values of certain types of transistors.

FIG. 5 is a normal probability plot illustrating threshold values of certain types of transistors. In FIG. 5, the horizontal axis represents a threshold value indicated by a transistor, and the vertical axis represents a variation. As illustrated in FIG. 5, the inventor has discovered that variation and decrease in threshold value occur in certain types of transistors. Such variation and decrease in threshold value have been conspicuous in transistors having a gate width W of 1 µm or less.

As a result of various analyses by the inventor, it was found out that crystal defects occurs in the active regions under the gate electrode in the above-described transistor, and these crystal defects are one factor of the variation and reduction in the threshold value of the transistor. This is presumed to be because stress is generated in the active region by arranging the source/drain contacts in the extension direction of the active region, and crystal defects are generated due to the thermal history and the like during formation of the memory cell array above the transistor.

As a result of intensive research, the inventor has found a configuration for relaxing the stress to the active region AA by the source/drain contacts CS similarly to the semiconductor device 2 of the embodiment.

In the semiconductor device 2 according to the embodiment, in the source/drain contacts CS arranged in the same active region AA, the extension direction Dcs of the bottom surfaces of the source/drain contacts CS is not aligned in a straight line with the extension direction Daa of the active region AA. The bottom surfaces of the source/drain contacts CS have an elongated shape, and thus, it is presumed that the stresses of these are mainly generated in the extension direction Dcs of the bottom surfaces. In the above configuration, the stresses of the bottom surfaces of the source/drain contacts CS are applied in different directions to the extension direction Daa of the active region AA. As a result, the crystal defects in the active region AA are suppressed, and thus, it is possible to suppress the variations and reductions in the threshold value of the transistor Tr.

FIRST MODIFIED EXAMPLE

In the above-described embodiment, the inclinations of the bottom surfaces of the source/drain contacts CS with respect to the active region AA are all the same direction, but the embodiment is not limited thereto.

Figure 6:
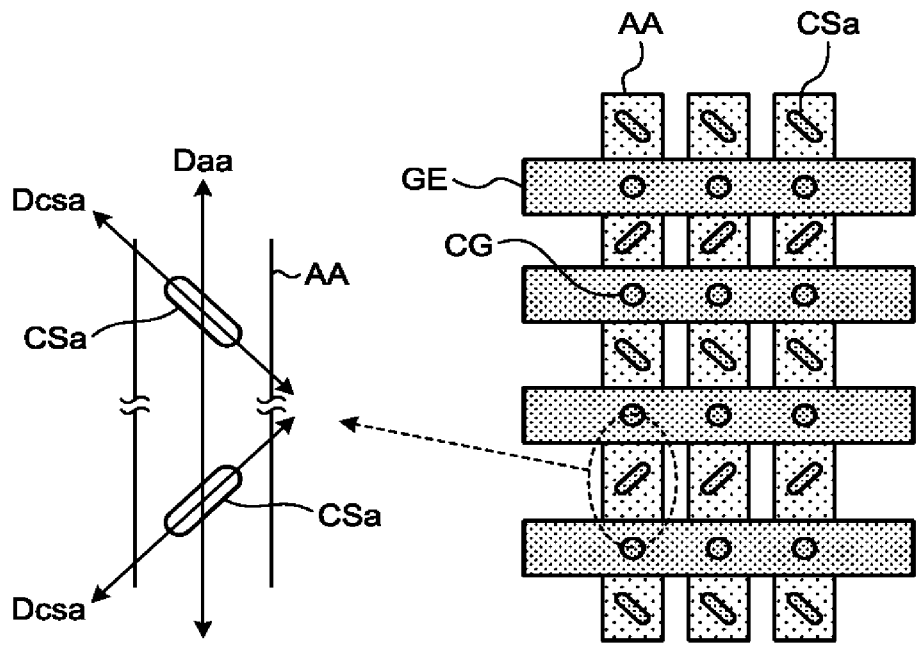
FIG. 6 is a plan view schematically illustrating an example of a configuration of a semiconductor device included in a nonvolatile memory according to a first modified example of the embodiment.

FIG. 6 is a plan view schematically illustrating an example of a configuration of a semiconductor device included in a nonvolatile memory according to a first modified example of the embodiment. As illustrated in FIG. 6, in source/drain contacts CSa arranged in the same active region AA, the directions of the inclinations of the bottom surfaces of the source/drain contacts CSa with respect to the active region AA may be alternately reversed.

By arranging the source/drain contacts CSa in this manner, an extension direction Dcsa of the bottom surfaces of the source/drain contacts CSa arranged in the same active region AA is not aligned in a straight line with the extension direction Daa of the active region AA. Similarly, the extension direction Dcsa of the bottom surfaces of the source/drain contacts CSa arranged in the same active region AA is not aligned in a straight line with the direction in which the crystal of the wafer cleaves either

SECOND MODIFIED EXAMPLE

In the above-described embodiment, the bottom surfaces of the source/drain contacts CS are inclined with respect to the active region AA, but the embodiment is not limited thereto.

Figure 7:
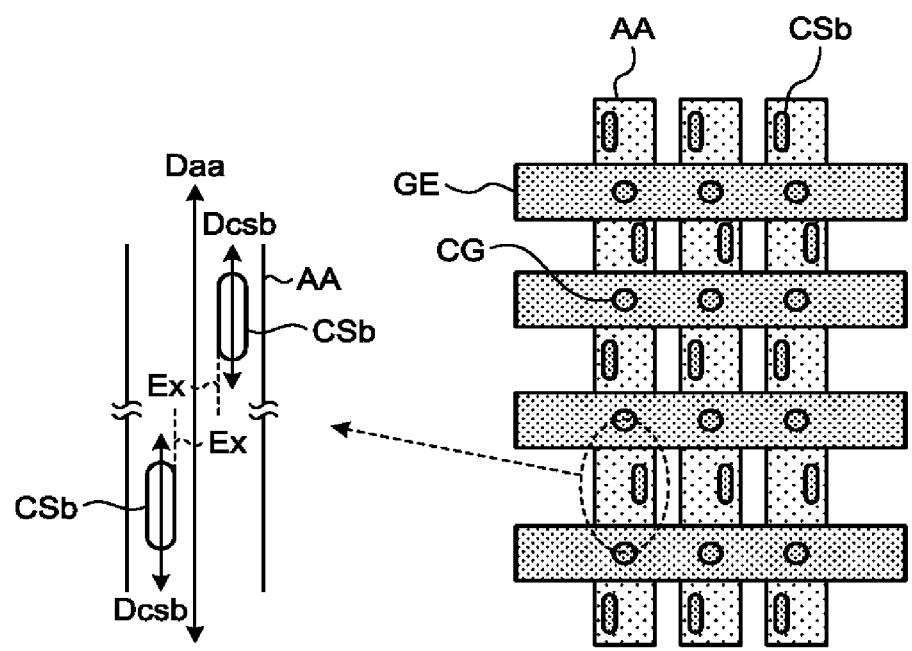
FIG. 7 is a plan view schematically illustrating an example of a configuration of a semiconductor device included in a nonvolatile memory according to a second modified example of the embodiment.

FIG. 7 is a plan view schematically illustrating an example of a configuration of a semiconductor device included in a nonvolatile memory according to a second modified example of the embodiment. As illustrated in FIG. 7, in source/drain contacts CSb arranged in the same active region AA, the positions of the source/drain contacts CSb in the active region AA may be alternately different.

Specifically, in the semiconductor device according to the second modified example of the embodiment, the source/drain contacts CSb in the first column of the active region AA are arranged near one end portion in the transverse direction of the active region AA. In addition, the source/drain contacts CSb in the second column of the active region AA are arranged near the other end portion in the transverse direction of the active region AA. In this case, although the shift width is arbitrary, it is preferable that the shift width is set to the extent that extension lines Ex of end portions of the bottom surfaces of the source/drain contacts CSb in the transverse direction do not overlap with each other. In this manner, in the semiconductor device according to the second modified example of the embodiment, the source/drain contacts CSb are arranged in a zigzag manner with respect to the extension direction Daa of the active region AA.

By arranging the source/drain contacts CSb in such a manner, an extension direction Dcsb of the bottom surfaces of the source/drain contacts CSb arranged in the same active region AA is not aligned in a straight line with the extension direction Daa of the active region AA. Similarly, the extension direction Dcsb of the bottom surfaces of the source/drain contacts CSb arranged in the same active region AA are not aligned in a straight line with the direction in which the crystal of the wafer cleaves either.

In addition to the first and second modified examples described above, the source/drain contacts can also be configured in any arrangement, if the extension direction(s) of the bottom surfaces of the source/drain contacts is not aligned in a straight line with the extension direction of the active region in such arrangement.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a transistor having
      a diffusion layer arranged in a substrate and exposed on a surface of the substrate, elongated in a first direction along the surface of the substrate, and
      a gate electrode arranged above the diffusion layer; and
   contacts arranged in the first direction on both sides of the gate electrode and each connected to the diffusion layer, the contacts having elongated bottom surfaces,
   wherein elongated dimensions of any neighboring pair of the bottom surfaces across the gate electrode are not mutually aligned in a straight line or along a cleavage direction of a crystal of the substrate,
   wherein none of the elongated dimensions is perpendicular to the first direction.

2. The semiconductor device according to claim 1, wherein the elongated dimensions of the bottom surfaces of the contacts intersect the first direction.

3. The semiconductor device according to claim 1,
   wherein a first contact of the contacts on one side of the gate electrode is arranged so that an extension direction of the bottom surface of the first contact is along a first direction, the first direction intersecting the extension direction of the diffusion layer, and
   wherein a second contact of the contacts on the other side of the gate electrode is arranged so that an extension direction of the bottom surface of the second contact is along a second direction, the second direction intersecting the extension direction of the diffusion layer and the first direction.

4. The semiconductor device according to claim 1,
   wherein the contacts are arranged so that extension directions of the bottom surfaces of the contacts are inclined with respect to the extension direction of the diffusion layer, and
   wherein the extension direction of the bottom surface of a first contact of the contacts on one side of the gate electrode and the extension direction of the bottom surface of a second contact of the contacts on the other side of the gate electrode are reversed in a direction of the inclination.

5. The semiconductor device according to claim 1, wherein the contacts are arranged in a zigzag manner with respect to the extension direction of the diffusion layer.

6. The semiconductor device according to claim 5, wherein the contacts are arranged so that an extension direction of the bottom surfaces of the contacts is parallel to the extension direction of the diffusion layer.

7. The semiconductor device according to claim 1,
   wherein the contacts are arranged so that an extension direction of the bottom surfaces of the contacts is parallel to the extension direction of the diffusion layer, and
   wherein a first contact of the contacts on one side of the gate electrode is arranged near one end of the diffusion layer in a width direction of the diffusion layer and a second contact of the contacts on the other side of the gate electrode is arranged near the other end of the diffusion layer in the width direction.

8. The semiconductor device according to claim 1, further comprising a plurality of transistors in addition to the transistor, wherein the plurality of transistors include contacts that are arranged in the first direction.

9. The semiconductor device according to claim 1, wherein the elongated dimensions of the bottom surfaces of the contacts intersect the cleavage direction of the crystal of the substrate.

10. The semiconductor device according to claim 1,
wherein a first contact of the contacts on one side of the gate electrode is arranged so that an extension direction of the bottom surface of the first contact is along a first direction, the first direction intersecting the cleavage direction of the crystal of the substrate, and
wherein a second contact of the contacts on the other side of the gate electrode is arranged so that an extension direction of the bottom surface of the second contact is along a second direction, the second direction intersecting the cleavage direction of the crystal of the substrate and the first direction.

11. The semiconductor device according to claim 1,
wherein the contacts are arranged so that extension directions of the bottom surfaces of the contacts are inclined with respect to the cleavage direction of the crystal of the substrate, and
wherein the extension direction of the bottom surface of a first contact of the contacts on one side of the gate electrode and the extension direction of the bottom surface of a second contact of the contacts on the other side of the gate electrode are reversed in a direction of the inclination.

12. The semiconductor device according to claim 1, wherein the contacts are arranged in a zigzag manner with respect to the cleavage direction of the crystal of the substrate.

13. The semiconductor device according to claim 12, wherein the contacts are arranged so that an extension direction of the bottom surfaces of the contacts is parallel to the cleavage direction of the crystal of the substrate.

14. The semiconductor device according to claim 1,
wherein the contacts are arranged so that an extension direction of the bottom surfaces of the contacts is parallel to the cleavage direction of the crystal of the substrate, and
wherein a first contact of the contacts on one side of the gate electrode is arranged near one end of the diffusion layer in a width direction of the diffusion layer and a second contact of the contacts on the other side of the gate electrode is arranged near the other end of the diffusion layer in the width direction.

15. A nonvolatile memory comprising:
a memory cell array arranged above a substrate; and
a peripheral circuit arranged between the substrate and the memory cell array,
wherein the peripheral circuit includes:
a transistor having
a diffusion layer arranged in the substrate and exposed on a surface of the substrate, elongated in a first direction along the surface of the substrate, and
a gate electrode arranged above the diffusion layer; and
contacts arranged in the first direction on both sides of the gate electrode and each connected to the diffusion layer, the contacts having elongated bottom surfaces, elongated dimensions of any neighboring pair of the bottom surfaces across the gate electrode being not mutually aligned in a straight line or along a cleavage direction of a crystal of the substrate, wherein none of the elongated dimensions is perpendicular to the first direction, and
wherein the memory cell array includes:
a plurality of word lines stacked in a direction perpendicular to the surface of the substrate; and
a plurality of pillars penetrating the plurality of word lines in the direction perpendicular to the surface of the substrate, each memory cell being formed at each of intersections of the plurality of word lines and the plurality of pillars.

16. The nonvolatile memory according to claim 15, wherein, in the peripheral circuit, the elongated dimensions of the bottom surfaces of the contacts intersect the first direction.

17. The nonvolatile memory according to claim 15, wherein, in the peripheral circuit, the contacts are arranged so that extension directions of the bottom surfaces of the contacts are inclined with respect to the extension direction of the diffusion layer, the extension direction of the bottom surface of a first contact of the contacts on one side of the gate electrode and the extension direction of the bottom surface of a second contact of the contacts on the other side of the gate electrode being reversed in a direction of the inclination.

18. The nonvolatile memory according to claim 15, wherein, in the peripheral circuit, the contacts are arranged in a zigzag manner with respect to the extension direction of the diffusion layer.

* * * * *